(12) United States Patent
Kimoto et al.

(10) Patent No.: US 12,563,766 B2
(45) Date of Patent: Feb. 24, 2026

(54) SiC SEMICONDUCTOR DEVICE MANUFACTURING METHOD AND SiC MOSFET

(71) Applicant: KYOTO UNIVERSITY, Kyoto (JP)

(72) Inventors: Tsunenobu Kimoto, Kyoto (JP); Keita Tachiki, Kyoto (JP)

(73) Assignee: KYOTO UNIVERSITY, Kyoto (JP)

( * ) Notice: Subject to any disclaimer, the term of this patent is extended or adjusted under 35 U.S.C. 154(b) by 390 days.

(21) Appl. No.: 18/268,131

(22) PCT Filed: Oct. 22, 2021

(86) PCT No.: PCT/JP2021/039171
§ 371 (c)(1),
(2) Date: Jun. 16, 2023

(87) PCT Pub. No.: WO2022/130788
PCT Pub. Date: Jun. 23, 2022

(65) Prior Publication Data
US 2024/0071764 A1 Feb. 29, 2024

(30) Foreign Application Priority Data

Dec. 18, 2020 (JP) ................................. 2020-210594

(51) Int. Cl.
*H01L 21/04* (2006.01)
*H01L 21/02* (2006.01)
(Continued)

(52) U.S. Cl.
CPC ...... *H01L 21/045* (2013.01); *H01L 21/02164* (2013.01); *H01L 21/02271* (2013.01); *H10D 30/60* (2025.01); *H10D 62/8325* (2025.01)

(58) Field of Classification Search
CPC ............... H01L 21/02; H01L 21/02164; H01L 21/02211; H01L 21/02216;
(Continued)

(56) References Cited

U.S. PATENT DOCUMENTS

| | | | |
|---|---|---|---|
| 2003/0073270 A1* | 4/2003 | Hisada | H10D 30/66 257/E29.259 |
| 2009/0090919 A1* | 4/2009 | Uchida | H01L 21/049 257/77 |

(Continued)

FOREIGN PATENT DOCUMENTS

JP 11-67757 A 3/1999

OTHER PUBLICATIONS

Chung et al., "Improved Inversion Channel Mobility for 4H—SiC MOSFETs Following High Temperature Anneals in Nitric Oxide", IEEE Electron Device Letters, Apr. 2001, vol. 22, No. 4, pp. 176-178.

(Continued)

*Primary Examiner* — Brook Kebede
(74) *Attorney, Agent, or Firm* — Birch, Stewart, Kolasch & Birch, LLP

(57) ABSTRACT

A SiC semiconductor device manufacturing method includes a step of etching a surface of a SiC substrate 1 with H₂ gas under Si-excess atmosphere within a temperature range of 1000° C. to 1350° C., a step of depositing, by a CVD method, a SiO₂ film 2 on the SiC substrate 1 at such a temperature that the SiC substrate 1 is not oxidized, and a step of thermally treating the SiC substrate 1, on which the SiO₂ film 2 is deposited, in NO gas atmosphere within a temperature range of 1150° C. to 1350° C.

6 Claims, 10 Drawing Sheets

(51) Int. Cl.
    *H10D 30/60*       (2025.01)
    *H10D 62/832*     (2025.01)

(58) Field of Classification Search
    CPC ......... H01L 21/02332; H01L 21/02337; H01L
                21/02266; H01L 21/02271; H01L
            21/02274; H01L 21/045; H01L 21/049;
            H01L 21/3065; H10D 30/60; H10D
          30/40; H10D 62/80; H10D 62/832; H10D
                     62/8325; H10D 62/882
    See application file for complete search history.

(56)               References Cited

U.S. PATENT DOCUMENTS

| | | |
|---|---|---|
| 2012/0241767 A1 | 9/2012 | Yano et al. |
| 2018/0005828 A1* | 1/2018 | Fujii ................... H01L 21/0475 |
| 2018/0308937 A1* | 10/2018 | Hirose ................ H10D 64/693 |

OTHER PUBLICATIONS

International Search Report for PCT/JP2021/039171 mailed on Dec. 28, 2021.
Kobayashi et al., "Design and formation of SiC (0001)/$SiO_2$ interfaces via Si deposition followed by low-temperature oxidation and high-temperature nitridation", Applied Physics Express, Aug. 14, 2020, vol. 13, pp. 091003-1 to 091003-4.

* cited by examiner

SiC SEMICONDUCTOR DEVICE MANUFACTURING METHOD AND SiC MOSFET

TECHNICAL FIELD

The present invention relates to a silicon carbide (SiC) semiconductor device manufacturing method and a SiC MOSFET.

BACKGROUND ART

In a MOS transistor (SiC MOSFET) using a SiC substrate, in a case where a $SiO_2$ film (gate insulating film) is formed on a surface of the SiC substrate by thermal oxidation, there is a problem that a defect density at an interface between the $SiO_2$ film and the SiC substrate is extremely high. If the interface defect density is high, sufficient performance of the SiC MOSFET, such as a channel mobility, cannot be obtained.

As a method for reducing the interface defect density, Patent Document 1 discloses a method in which instead of directly forming a $SiO_2$ film on a surface of a SiC substrate by thermal oxidation, a Si thin film is deposited on a surface of a SiC substrate and is subsequently oxidized and a $SiO_2$ film is formed accordingly.

Non-Patent Document 1 discloses a method (interface nitridation) in which thermal treatment is performed in nitrogen monoxide (NO) gas atmosphere after a $SiO_2$ film has been formed on a surface of a SiC substrate by thermal oxidation and an interface between the $SiO_2$ film and the SiC substrate is nitrided accordingly.

In these methods, the defect density at the interface between the $SiO_2$ film and the SiC substrate can be reduced, but the defect density is still high. For this reason, the performance of the SiC MOSFET is greatly limited. Further, in the method in which the interface between the $SiO_2$ film and the SiC substrate is nitrided by the NO thermal treatment, not only interface nitridation but also oxidation proceeds. For this reason, the interface defect density cannot be sufficiently reduced.

As another method for reducing the interface defect density, Non-Patent Document 2 discloses a method in which a $SiO_2$ film is formed on a SiC substrate after a surface of the SiC substrate has been etched with high-temperature $H_2$ gas and the SiC substrate formed with the $SiO_2$ film is subsequently thermally treated in high-temperature $N_2$ gas atmosphere. Here, the $SiO_2$ film is formed in such a manner that a Si thin film is deposited on the SiC substrate and is subsequently thermally oxidized at such a temperature that the SiC substrate is not oxidized.

CITATION LIST

Patent Document

PATENT DOCUMENT 1: Japanese Unexamined Patent Publication No. 11-067757 Non-Patent Document
NON-PATENT DOCUMENT 1: G. Y. Chung et al., IEEE Electron Device Lett., vol. 22, 176 (2001)
NON-PATENT DOCUMENT 2: T. Kobayashi et al., Appl. Phys. Express, vol. 13, 091003 (2020)

SUMMARY OF THE INVENTION

Technical Problem

According to the method disclosed in Non-Patent Document 2, the defect density at the interface between the $SiO_2$ film and the SiC substrate can be significantly reduced, but in a case where a gate insulating film of $SiO_2$ is formed on the SiC substrate by this method and a SiC MOSFET is formed accordingly, a high channel mobility is obtained, but normally-on characteristics with a negative threshold voltage are easily brought.

The present invention has been made in view of the above-described points, and a main object thereof is to provide a SiC semiconductor device manufacturing method capable of forming a SiC MOSFET having a high channel mobility and normally-off characteristics.

Solution to the Problem

The SiC semiconductor device manufacturing method according to the present invention includes a step of etching a surface of a SiC substrate with $H_2$ gas under Si-excess atmosphere within a temperature range of 1000° C. to 1350° C., a step of depositing, by a CVD method, a $SiO_2$ film on the SiC substrate at such a temperature that the SiC substrate is not oxidized, and a step of thermally treating the SiC substrate, on which the $SiO_2$ film is deposited, in NO gas atmosphere within a temperature range of 1150° C. to 1350° C.

Advantages of the Invention

According to the present invention, the SiC semiconductor device manufacturing method capable of forming the SiC MOSFET having the high channel mobility and the normally-off characteristics can be provided.

DESCRIPTION OF EMBODIMENTS

Hereinafter, an embodiment of the present invention will be described in detail based on the drawings. Note that the present invention is not limited to the following embodiment. Moreover, changes can be made as necessary without departing from a scope in which advantageous effects of the present invention are obtained.

Figure 1A:
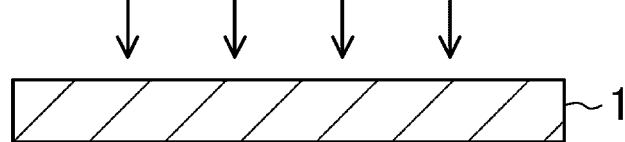
FIGS. 1A to 1C show views of a SiC semiconductor device manufacturing method in one embodiment of the present invention.
Figure 1B:
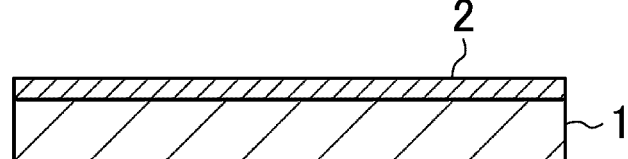
Figure 1C:
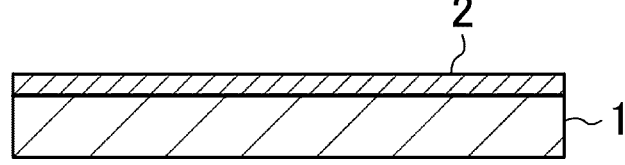

FIGS. 1A to 1C are views showing a SiC semiconductor device manufacturing method in one embodiment of the present invention.

As shown in FIG. 1A, a surface of a SiC substrate 1 is etched with high-temperature $H_2$ gas under Si-excess atmosphere. At this point, an extremely-thin (one-to-three monolayer thcikness) Si film is formed on the SiC substrate 1. Etching with high-temperature $H_2$ gas is performed by addition of a slight amount of $SiH_4$ gas, and may be performed, for example, under conditions of a $H_2$ flow rate: 5000 sccm, a $SiH_4$ flow rate: 0.2 sccm, a temperature: 1300° C., a pressure: 13 kPa, and a time: 15 minutes. Etching with high-temperature $H_2$ gas is preferably performed within a temperature range of 1000° C. to 1350° C. Note that optimal gas flow rate, pressure, and time depend on an apparatus that performs this processing. If an extremely-thin Si film is formed on the SiC substrate with gas containing Si, such as $SiH_2Cl_2$ or $SiH_3Cl$, instead of $SiH_4$, similar advantageous effects are also obtained.

As the SiC substrate 1, one configured such that a SiC epitaxial layer (not shown) is formed on the SiC substrate 1 may be used. Note that preferably when a MOSFET is formed on the SiC epitaxial layer, a surface of the SiC epitaxial layer is oxidized, and thereafter, the oxide film is removed.

Next, as shown in FIG. 1B, a $SiO_2$ film 2 is deposited on the SiC substrate 1 by a plasma CVD method. The $SiO_2$ film 2 may be deposited at such a temperature that the SiC substrate 1 is not oxidized, and for example, may be deposited under conditions of a tetraethoxysilane (TEOS) flow rate: 0.3 seem, an $O_2$ flow rate: 450 seem, a temperature: 400° C., a pressure: 34 Pa, a radio-frequency power: 100 W, and a time: 30 minutes. The $SiO_2$ film 2 is preferably deposited within a temperature range of 300° C. to 450° C.

Note that the $SiO_2$ film 2 may be deposited using a thermal CVD method. In this case, the $SiO_2$ film 2 may be deposited under conditions of a $SiH_4$ flow rate: 5 seem, a $N_2O$ flow rate: 300 seem, a $N_2$ flow rate: 3000 seem, a temperature: 720° C., a pressure: 15 Pa, and a time: 4 minutes.

Next, as shown in FIG. 1C, the SiC substrate 1 on which the $SiO_2$ film 2 is deposited is thermally treated in NO gas atmosphere. Conditions for the thermal treatment may be, for example, a NO flow rate: 300 seem, a $N_2$ flow rate: 2700 seem, a temperature: 1250° C., a pressure: 1 atm, and a time: 60 minutes. The thermal treatment in NO gas atmosphere is preferably performed within a temperature range of 1150° C. to 1350° C. Here, "in NO gas atmosphere" includes atmosphere in which NO gas is diluted with dilution gas such as $N_2$ gas. For example, in the present embodiment, in order to reduce the amount of use of NO gas with toxicity, the thermal treatment is performed in atmosphere in which NO gas is diluted (NO flow rate: 10%; $N_2$ flow rate: 90%) with $N_2$ gas.

(Analysis of Interface Defect Density)

A MOS capacitor was formed on the $SiO_2$ film 2 deposited on the SiC substrate 1 by the method shown in FIGS. 1A to 1C, and a defect density (interface state density) at an interface between the $SiO_2$ film 2 and the SiC substrate 1 was obtained using analysis (high-low method) of C—V characteristics. For the SiC substrate 1, an n-type 4H—SiC (0001) substrate was used, and a donor concentration in a SiC epitaxial growth layer was $5 \times 10^{15}$ cm$^{-3}$. Moreover, the thickness of the $SiO_2$ film 2 was about 30 nm.

Note that for comparison, a sample obtained in such a manner that by a method disclosed in Non-Patent Document 2, a $SiO_2$ film 2 is formed on a SiC substrate 1 having a surface subjected to high-temperature $H_2$ etching and the SiC substrate 1 is subsequently thermally treated in high-temperature $N_2$ gas atmosphere and a sample obtained in such a manner that a $SiO_2$ film 2 is formed on a surface of a SiC substrate 1 by thermal oxidation and the SiC substrate 1 is subsequently thermally treated in high-temperature NO gas atmosphere were also formed.

Figure 2:
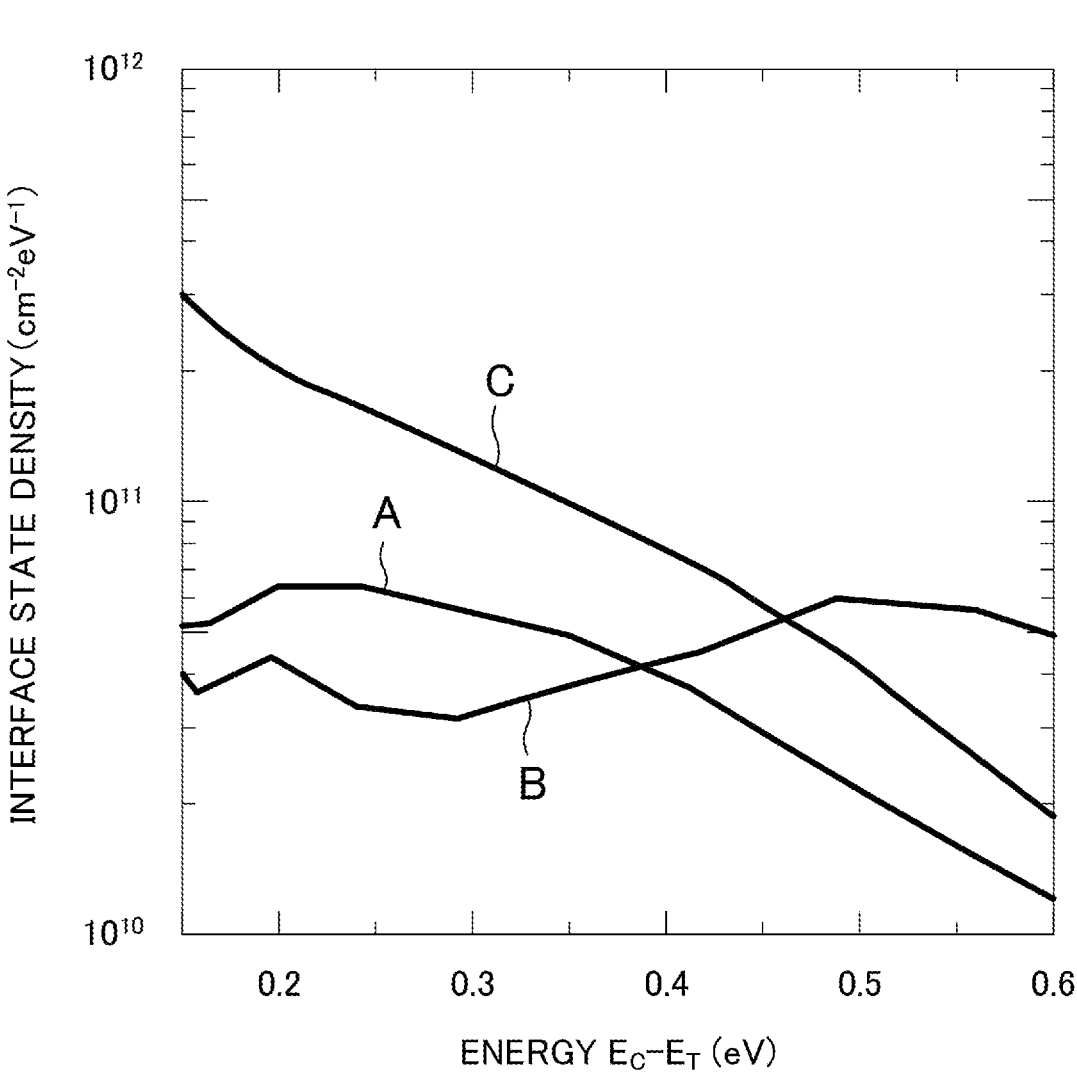
FIG. 2 shows graphs of a defect density at an interface between a $SiO_2$ film and a SiC substrate.

FIG. 2 shows graphs of results, the horizontal axis indicating an energy (ET) from a conduction band edge ($E_C$) and the vertical axis indicating the interface defect density. The graph indicated by A shows the results for the sample obtained in such a manner that the $SiO_2$ film 2 is deposited on the SiC substrate 1 by the method shown in FIGS. 1A to 1C and the SiC substrate 1 is subsequently thermally treated in high-temperature NO gas atmosphere. Moreover, the graph indicated by B shows the results for the sample obtained in such a manner that by the method disclosed in Non-Patent Document 2, the $SiO_2$ film is formed on the SiC substrate and the SiC substrate is subsequently thermally treated in high-temperature $N_2$ gas atmosphere. Further, the graph indicated by C shows the results for the sample obtained in such a manner that the $SiO_2$ film is formed on the surface of the SiC substrate by thermal oxidation and the SiC substrate is subsequently thermally treated in high-temperature NO gas atmosphere.

FIG. 2 shows that the samples (graphs A, B) whose SiC substrates were subjected to etching with high-temperature $H_2$ gas in Si-excess atmosphere as pretreatment before formation of the $SiO_2$ film on the SiC substrate have interface state densities significantly lower than that of the sample (graph C) whose SiC substrate was not subjected to etching with high-temperature $H_2$ gas as pretreatment.

According to these results, many defects remain on the surface of the SiC substrate 1 from which the oxide film has been removed after sacrificial oxidation of the surface, and in order to efficiently eliminate these defects, the surface of the SiC substrate 1 is etched with high-temperature $H_2$ gas in Si-excess atmosphere so that the interface state density can be significantly reduced.

(Characterization of Fabricated SiC MOSFET)

An n-channel MOSFET was fabricated with the $SiO_2$ film 2 deposited on the SiC substrate 1 by the method shown in FIGS. 1A to 1C, and transistor characteristics were evaluated. Note that for comparison, the sample obtained in such a manner that by the method disclosed in Non-Patent Document 2, the $SiO_2$ film is formed on the SiC substrate and the SiC substrate is subsequently thermally treated in high-temperature $N_2$ gas atmosphere was also formed.

Figure 3:
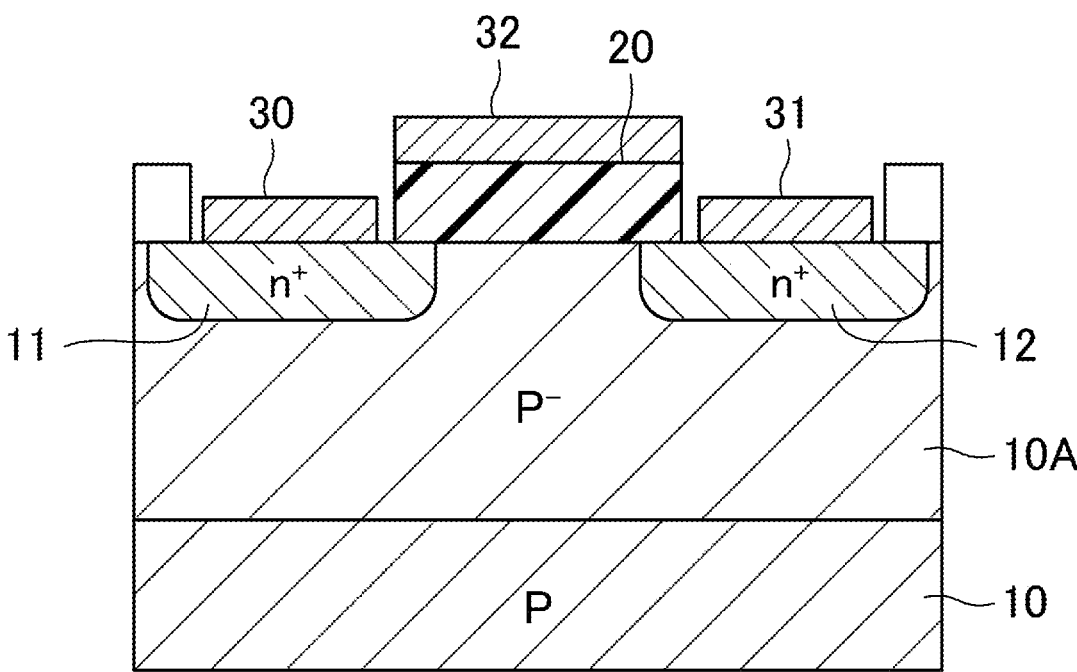
FIG. 3 shows a cross-sectional view of the structure of an n-channel MOSFET.

FIG. 3 is a cross-sectional view showing the structure of the formed n-channel MOSFET. A p$^-$-type SiC epitaxial growth layer 10A is formed on a p-type 4H—SiC(0001) substrate 10, and n$^+$-type source region 11 and drain region 12 are formed on a surface of the epitaxial growth layer 10A. A gate insulating film 20 formed of a $SiO_2$ film is formed on the surface of the epitaxial growth layer 10A between the source region 11 and the drain region 12. A source electrode 30, a drain electrode 31, and a gate electrode 32 are each formed on the source region 11, the drain region 12, and the gate insulating film 20.

Note that an acceptor concentration in the p$^-$-type SiC epitaxial growth layer 10A was $1 \times 10^{15}$ cm$^{-3}$ and a donor concentration in the source region 11 and the drain region 12 was $8 \times 10^{19}$ cm$^{-3}$. Moreover, the thickness of the gate insulating film 20 was 30 nm.

(A) Drain Current-Gate Voltage Characteristics

Figure 4:
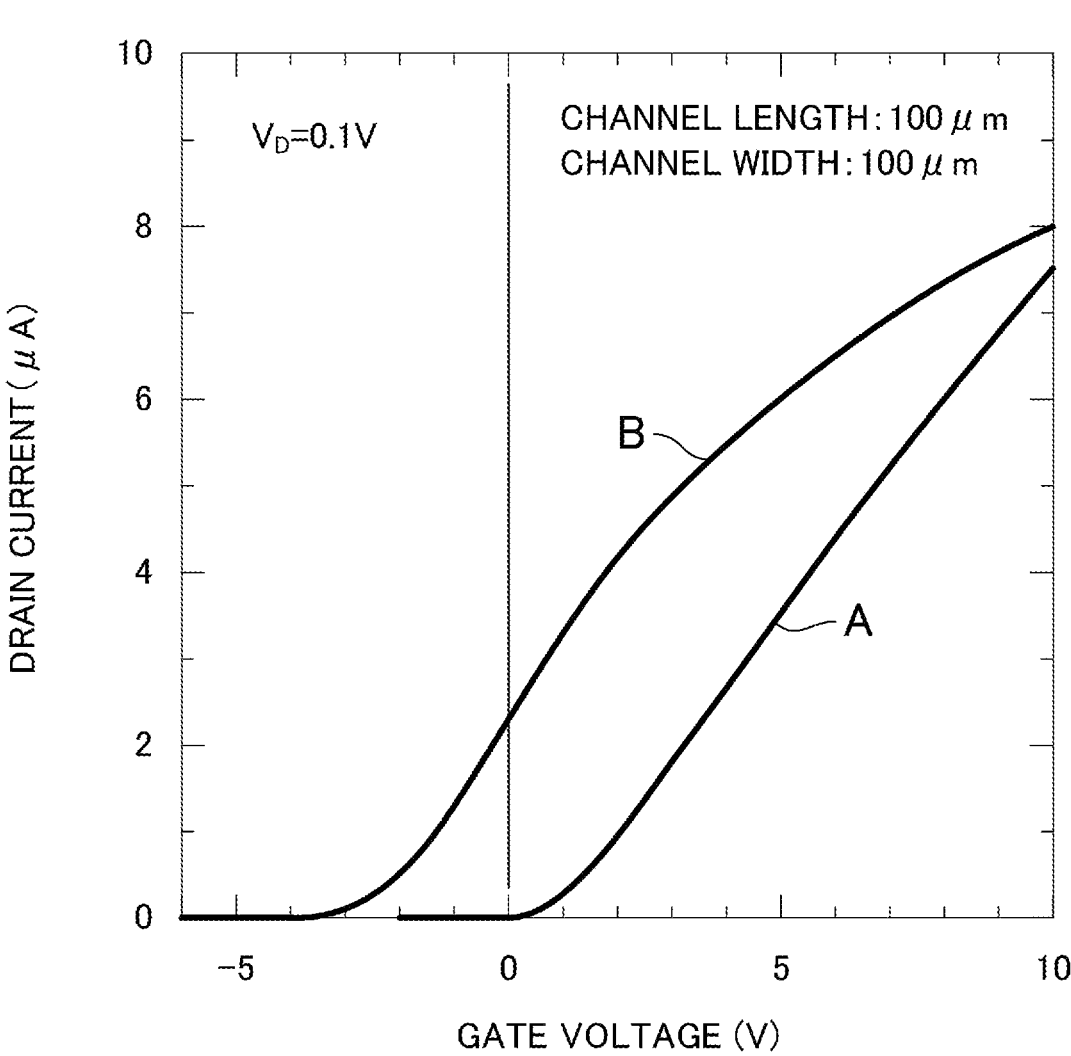
FIG. 4 shows graphs of the drain current-gate voltage characteristics of the n-channel MOSFET.

FIG. 4 shows graphs of the drain current-gate voltage characteristics of the fabricated n-channel MOSFET. A graph indicated by A shows results in a case where by the method shown in FIGS. 1A to 1C, the gate insulating film 20 is formed and the SiC substrate is subsequently thermally treated in high-temperature NO gas atmosphere. Moreover, a graph indicated by B shows results in a case where by the method disclosed in Non-Patent Document 2, the gate insulating film 20 is formed and the SiC substrate is subsequently thermally treated in high-temperature $N_2$ gas atmosphere.

FIG. 4 shows that both the samples have high drain currents, but the sample (graph A) whose SiC substrate was thermally treated in high-temperature NO gas atmosphere shows normally-off characteristics (positive threshold voltage) while the sample (graph B) whose SiC substrate was thermally treated in high-temperature $N_2$ gas atmosphere shows normally-on characteristics (negative threshold voltage).

(B) Channel Mobility

Figure 5:
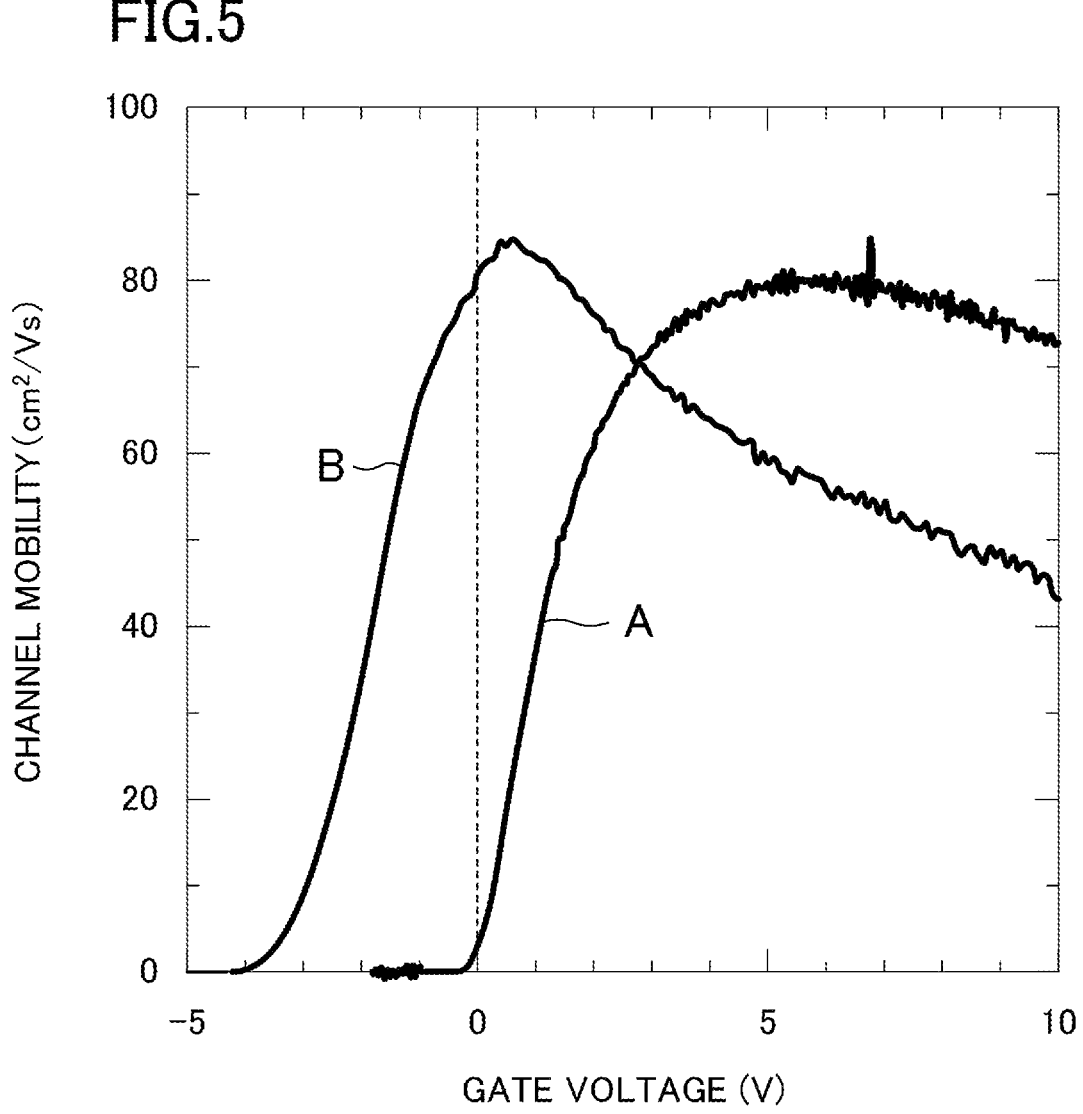
FIG. 5 shows graphs of the channel mobility of the n-channel MOSFET.

FIG. 5 shows graphs of the channel mobility of the formed n-channel MOSFET. A graph indicated by A shows results in a case where by the method shown in FIGS. 1A to 1C, the gate insulating film 20 is formed and the SiC substrate is subsequently thermally treated in high-temperature NO gas atmosphere. Moreover, a graph indicated by B shows results in a case where by the method disclosed in Non-Patent Document 2, the gate insulating film 20 is formed and the SiC substrate is subsequently thermally treated in high-temperature $N_2$ gas atmosphere.

FIG. 5 shows that both the samples have high channel mobilities, but the sample (graph A) whose SiC substrate was thermally treated in high-temperature NO gas atmosphere shows normally-off characteristics (positive threshold voltage) while the sample (graph B) whose SiC substrate was thermally treated in high-temperature $N_2$ gas atmosphere shows normally-on characteristics (negative threshold voltage). Note that the graph B shows a decrease in channel mobility at a high gate voltage.

According to these results, the SiC substrate 1 is etched with high-temperature $H_2$ gas in Si-excess atmosphere before deposition of the $SiO_2$ film 2 on the SiC substrate 1 and the SiC substrate 1 is thermally treated in high-temperature NO gas atmosphere after deposition of the $SiO_2$ film 2, so that a MOSFET having a high drain current and a high channel mobility and having normally-off characteristics can be obtained.

(Nitrogen Atom Density in $SiO_2$ Film and at $SiO_2$ Film/SiC Interface)

Figure 6:
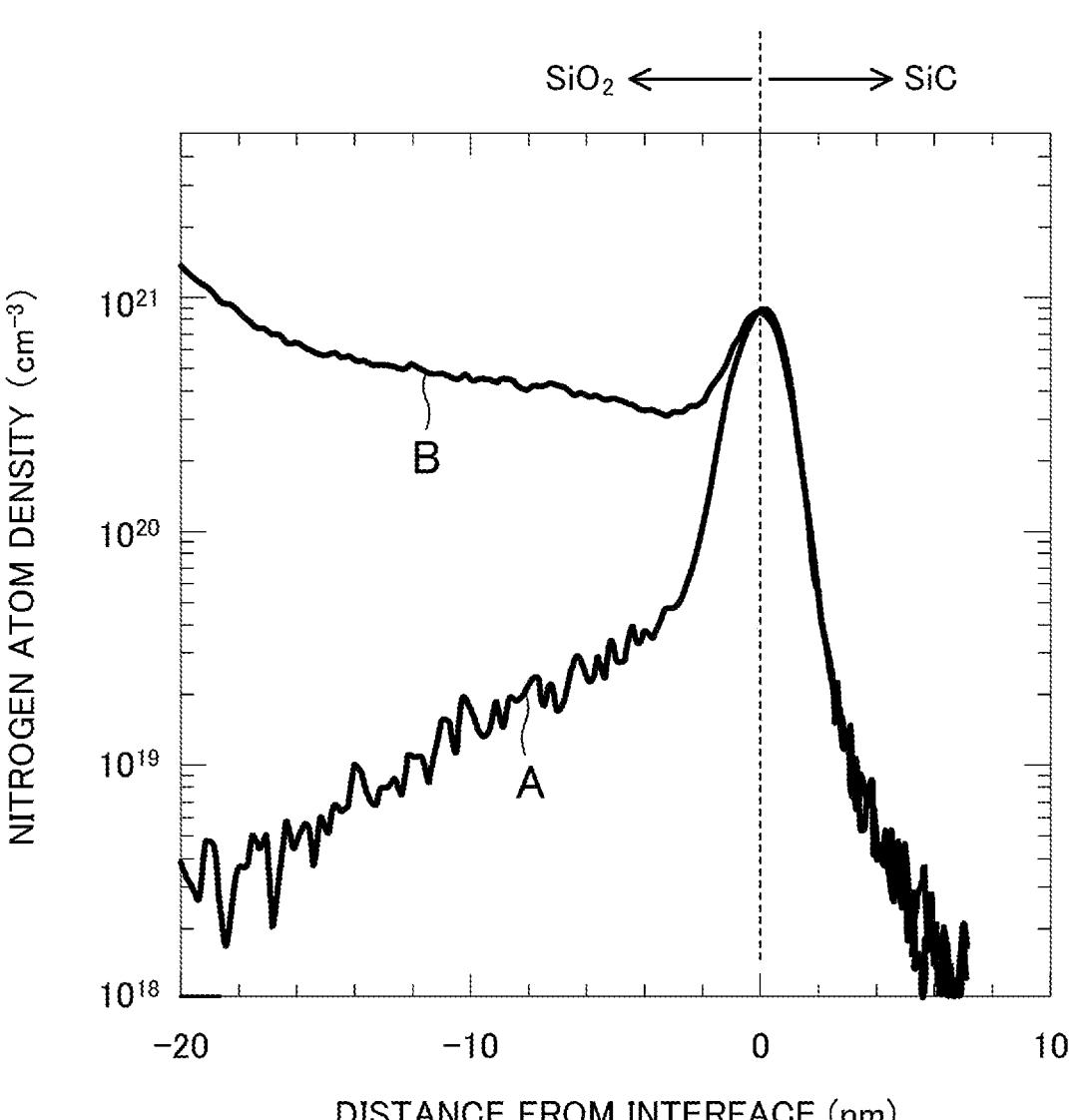
FIG. 6 shows graphs of a nitrogen atom density in the $SiO_2$ film and at the $SiO_2$ film/SiC substrate interface.

FIG. 6 shows graphs of measurement results of a nitrogen atom density in the $SiO_2$ film 2 and at the interface between the $SiO_2$ film 2 and the SiC substrate 1 by a secondary ion mass spectrometry (SIMS) method. The horizontal axis indicates a position in a film thickness direction, zero indicates the interface between the $SiO_2$ film 2 and the SiC substrate 1, a positive side indicates a position in the SiC substrate 1, and a negative side indicates a position in the $SiO_2$ film 2. Moreover, the vertical axis indicates the nitrogen atom density.

A graph indicated by A shows results for the sample obtained in such a manner that the $SiO_2$ film 2 is deposited on the SiC substrate 1 by the method shown in FIGS. 1A to 1C and the SiC substrate 1 is subsequently thermally treated in high-temperature NO gas atmosphere. Moreover, a graph indicated by B shows results for the sample obtained in such a manner that by the method disclosed in Non-Patent Document 2, the $SiO_2$ film 2 is formed on the SiC substrate 1 and the SiC substrate 1 is subsequently thermally treated in high-temperature $N_2$ gas atmosphere.

FIG. 6 shows that for both the samples, a sufficient density of nitrogen atoms is introduced into the interface between the $SiO_2$ film 2 and the SiC substrate 1. Thus, it is assumed that the defect density at the interface between the $SiO_2$ film 2 and the SiC substrate 1 is sufficiently reduced.

On the other hand, it shows that the nitrogen atom density in the $SiO_2$ film 2 is extremely low in the sample (graph A) whose the SiC substrate 1 was thermally treated in high-temperature NO gas atmosphere while a high density of nitrogen atoms is present in the $SiO_2$ film 2 in the sample (graph B) whose SiC substrate 1 was thermally treated in high-temperature $N_2$ gas atmosphere.

(Correlation Between Nitrogen Atom Density in $SiO_2$ Film and Effective Fixed Charge Density at Interface)

Figure 7:
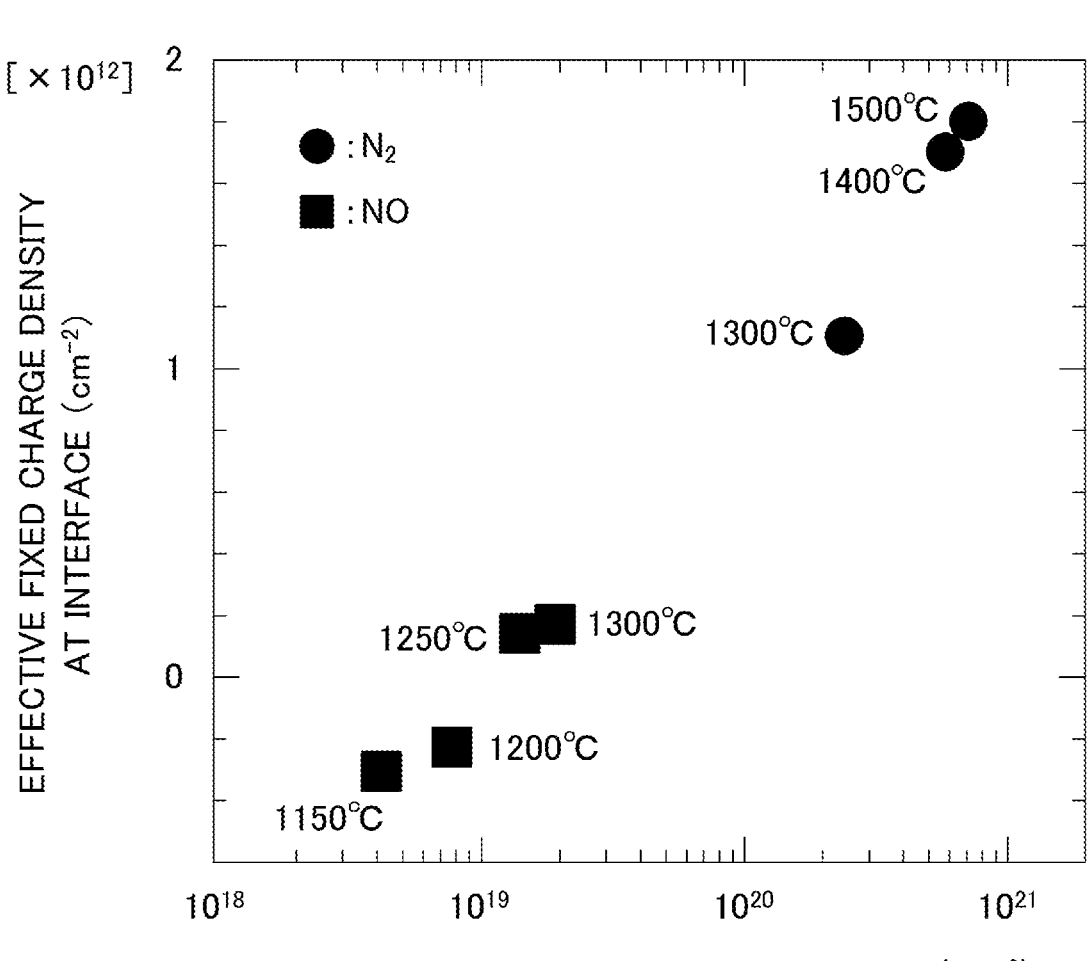
FIG. 7 shows graphs of a correlation between the nitrogen atom density in the $SiO_2$ film and an effective fixed charge density at the SiC substrate/$SiO_2$ film interface.

FIG. 7 shows graphs of a correlation between the nitrogen atom density in the $SiO_2$ film 2 and an effective fixed charged density at the interface between the $SiO_2$ film 2 and the SiC substrate 1. Here, the nitrogen atom density in the $SiO_2$ film 2 indicates the average of nitrogen atom densities in the $SiO_2$ film 2 in a region of 5 to 20 nm from the interface. Moreover, the effective fixed charge density at the interface was obtained from a voltage shift of an actual measurement value of the capacitance-voltage characteristics of the MOS capacitor from theoretical characteristics. A rectangular mark in the figure indicates a result for the sample whose SiC substrate 1 was thermally treated in high-temperature NO gas atmosphere. Moreover, a circular mark in the figure indicates a result for the sample whose SiC substrate 1 was thermally treated in high-temperature $N_2$ gas atmosphere. A numerical value near each symbol indicates a thermal treatment temperature.

FIG. 7 shows that the effective fixed charged density at the interface is high for the sample (circular marks) having a high nitrogen atom density in the $SiO_2$ film 2 and thermally treated in high-temperature $N_2$ gas atmosphere while the effective fixed charged density at the interface is low for the sample (rectangular marks) having a low nitrogen atom density in the $SiO_2$ film 2 and thermally treated in high-temperature NO gas atmosphere.

According to these results, it is assumed as follows. If the nitrogen atom density in the $SiO_2$ film 2 is extremely high, the nitrogen atoms and impurity atoms are bound to each other, and a positive fixed charge is generated in the $SiO_2$ film 2. Accordingly, the MOSFET shows normally-on characteristics. Conversely, if the nitrogen atom density in the $SiO_2$ film 2 is low, a positive fixed charge is less likely to be generated in the $SiO_2$ film 2, and accordingly, the MOSFET shows normally-off characteristics. Note that the impurity atoms to be bound to the nitrogen atoms are assumed to be, e.g., hydrogen introduced in a thermal treatment step (hydrogen sintering step) performed in atmosphere containing hydrogen at a final stage of fabricating the MOSFET.

As shown in FIG. 7, when the nitrogen atom density in the $SiO_2$ film 2 is low, there are cases where the effective fixed charge density at the interface between the $SiO_2$ film 2 and the SiC substrate 1 is negative and positive. This is because of the following reasons.

The effective fixed charge density at the interface between the $SiO_2$ film 2 and the SiC substrate 1 is represented as the sum of a positive charge due to an impurity or a defect in the $SiO_2$ film 2 (location close to the interface with the SiC substrate 1) and a negative charge due to electrons trapped at interface states. In a case where the NO treatment temperature is low, the positive charge is low because of a low nitrogen atom density in the $SiO_2$ film 2, but the negative charge is relatively high because of a relatively-high interface state density. As a result, the effective fixed charge density represented by a difference therebetween is negative.

On the other hand, in a case where the NO treatment temperature is high, the positive charge is high because of a high nitrogen atom density in the $SiO_2$ film 2, but the negative charge is relatively low because of a low interface state density. As a result, the effective fixed charge density is positive.

The effective fixed charge density is a great negative value when the interface state density is extremely high, and this is not preferable because the drain current of a SiC MOSFET is lowered. On the other hand, the effective fixed charge density is a great positive value when the nitrogen density in the $SiO_2$ film 2 is extremely high, and this is not preferable because normally-on (negative threshold voltage) characteristics are easily brought due to influence of this high positive charge density.

As shown in FIG. 7, the absolute value of the effective fixed charge density at the interface between the $SiO_2$ film 2 and the SiC substrate 1 is preferably $4 \times 10^1$ cm$^{-2}$ or less in order for the MOSFET to show normally-off characteristics.

(Dependency of Channel Mobility on NO Thermal Treatment Temperature)

Figure 8:
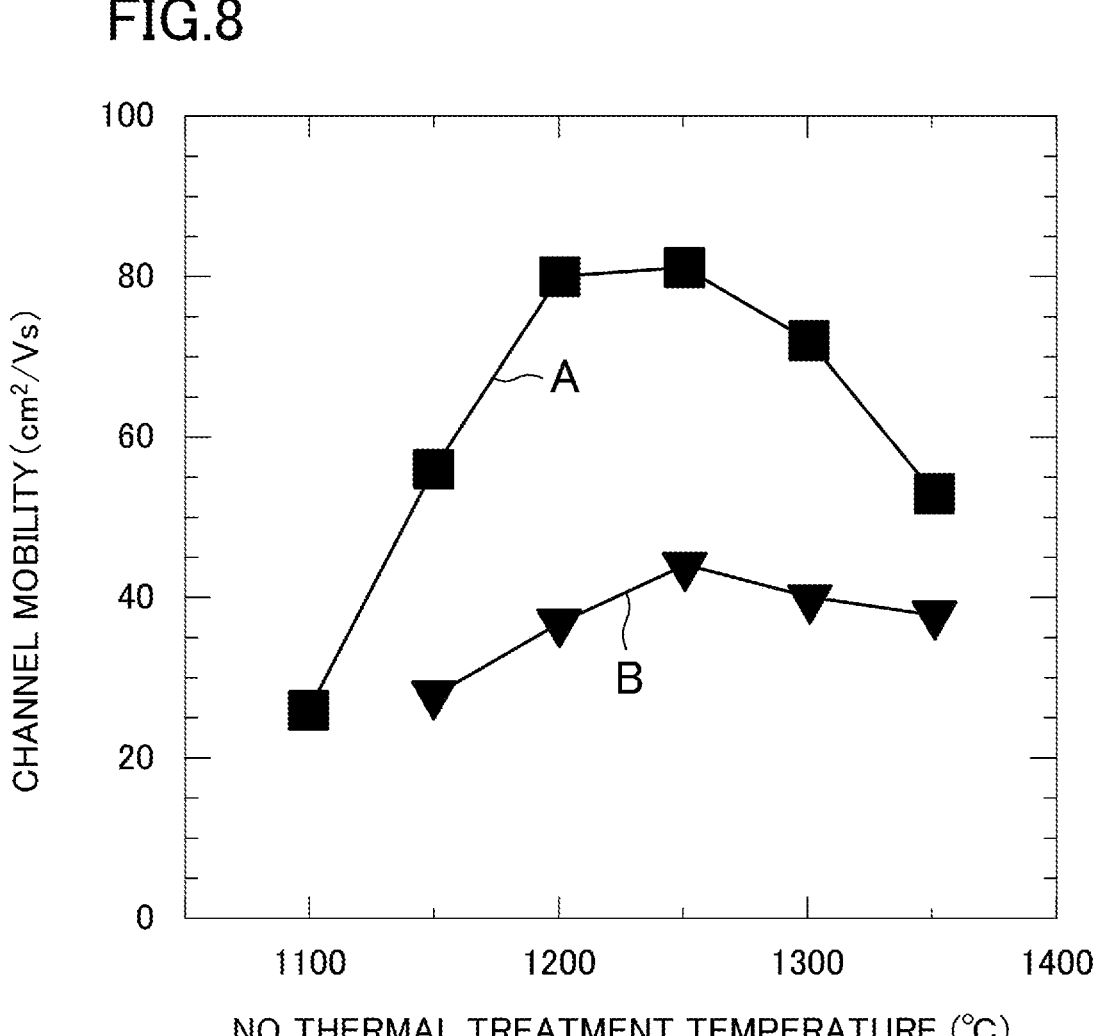
FIG. 8 shows graphs of the dependency of the channel mobility on a NO thermal treatment temperature.

FIG. 8 shows a graph (graph indicated by A) of measurement results of the channel mobility when a temperature of thermally treating the SiC substrate 1 in high-temperature NO gas atmosphere is changed within a range of 1100° C. to 1350° C. in a case where the n-channel MOSFET having, as the gate insulating film 20, the $SiO_2$ film 2 deposited on the SiC substrate 1 is formed by the method shown in FIGS. 1A to 1C. Moreover, a graph indicated by B shows results in a case where the SiC substrate 1 is etched with high-temperature $H_2$ gas without addition of a slight amount of $SiH_4$ gas and such etching is not performed under Si-excess atmosphere.

FIG. 8 shows that when the SiC substrate 1 is etched with high-temperature $H_2$ gas, the channel mobility is high in a case of performing etching under Si-excess atmosphere (graph A) while the channel mobility is low in a case of not performing etching under Si-excess atmosphere (graph B). This is because of the following reasons.

That is, an effect of reducing the interface defect density at the interface between the $SiO_2$ film 2 and the SiC substrate 1 can be expected in such a manner that the SiC substrate 1 is etched with high-temperature $H_2$ gas before formation of the $SiO_2$ film 2 on the SiC substrate 1. However, in a case where the $SiO_2$ film 2 is deposited on the SiC substrate 1 by the CVD method, reaction gas contains 02 gas or $N_2O$ gas, and for this reason, the surface of the SiC substrate 1 might be slightly oxidized initially during deposition. However, about one-to-three monolayer thick extremely-thin Si layer is formed on the surface of the SiC substrate 1 in such a manner that etching with high-temperature $H_2$ gas is performed under Si-excess atmosphere, and therefore, even in this case, only these extremely-thin Si layers are oxidized and oxidation of the surface of the SiC substrate 1 can be prevented. Thus, the interface defect density at the interface between the $SiO_2$ film 2 and the SiC substrate 1 is significantly reduced, and a high channel mobility is obtained.

On the other hand, in a case where etching with high-temperature $H_2$ gas is not performed under Si-excess atmosphere, no extremely-thin Si films are formed on the surface of the SiC substrate 1, and for this reason, even if the $SiO_2$ film is deposited under optimal conditions and the high-temperature NO thermal treatment is performed, the surface of the SiC substrate 1 is oxidized at an initial stage of depositing the $SiO_2$ film. As a result, the interface defect density at the interface between the $SiO_2$ film 2 and the SiC substrate 1 is not sufficiently reduced, and a low channel mobility is obtained.

FIG. 8 shows that a high channel mobility is obtained in such a manner that the NO thermal treatment for the SiC substrate 1 is performed within a temperature range of 1150° C. to 1350° C. If the NO thermal treatment temperature is lower than 1150° C., this is not preferable because a sufficient density of nitrogen atoms is not introduced into the interface between the $SiO_2$ film 2 and the SiC substrate 1, and for this reason, interface nitridation is not sufficiently performed and an effect of reducing the interface defect density cannot be obtained. If the NO thermal treatment temperature exceeds 1350° C., this is not preferable because oxidation of the SiC substrate due to NO gas progresses and new interface defects are generated.

(Dependency of Channel Mobility on Hydrogen Etching Temperature)

Figure 9:
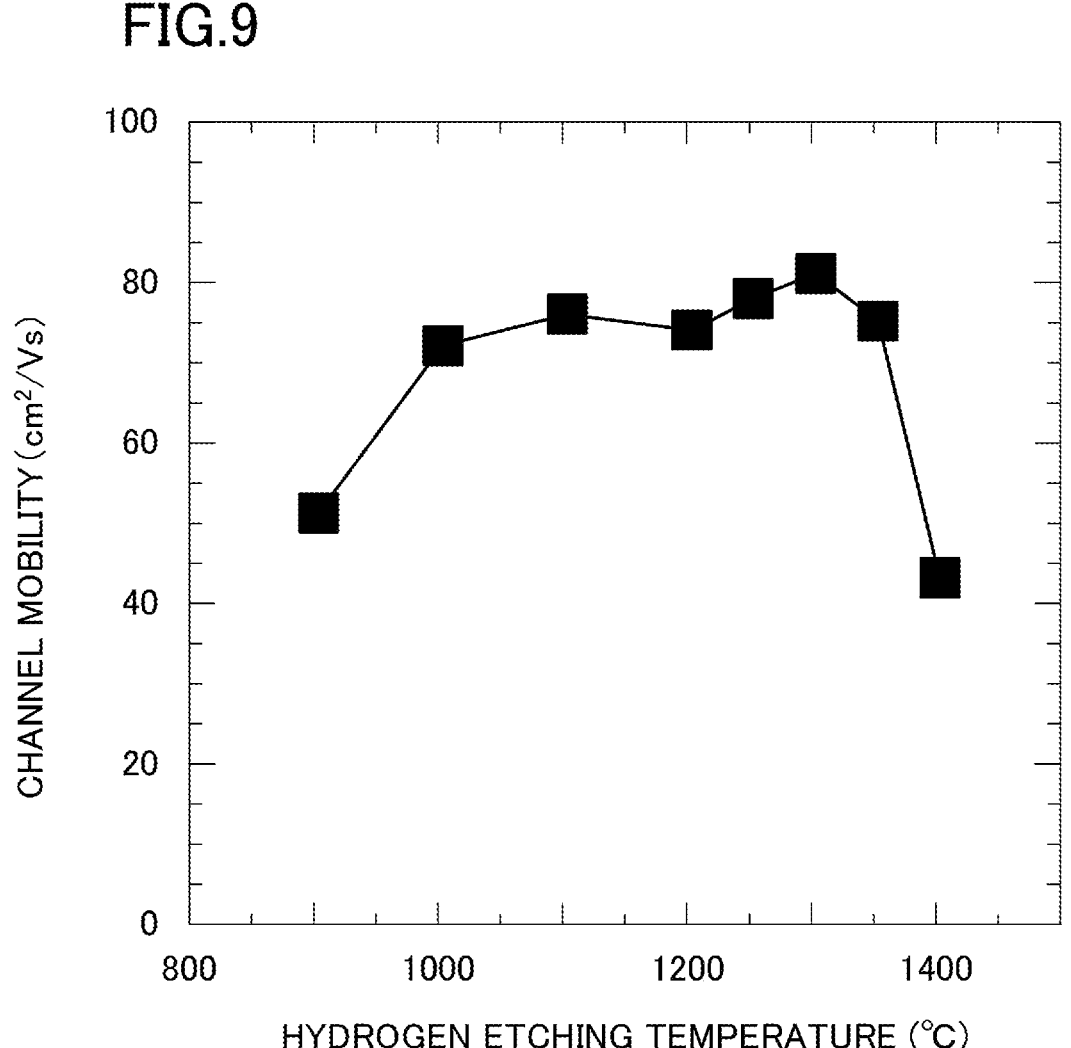
FIG. 9 shows a graph of the dependency of the channel mobility on a hydrogen etching temperature.

FIG. 9 shows a graph of measurement results of the channel mobility when a temperature of hydrogen-etching the SiC substrate 1 in Si-excess atmosphere is changed within a range of 900° C. to 1400° C. before formation of the $SiO_2$ film 2 in a case where the n-channel MOSFET having, as the gate insulating film 20, the $SiO_2$ film 2 deposited on the SiC substrate 1 is formed by the method shown in FIGS. 1A to 1C.

FIG. 9 shows that a high channel mobility is obtained in such a manner that hydrogen etching for the SiC substrate 1 is performed within a temperature range of 1000° C. to 1350° C. If the hydrogen etching temperature is lower than 1000° C., this is not preferable because the surface of the SiC substrate 1 cannot be sufficiently cleaned and an effect of reducing the interface defect density cannot be obtained. If the hydrogen etching temperature exceeds 1400° C. close to a Si melting point (1420° C.), this is not preferable because it is difficult to form the extremely-thin Si film on the surface of the SiC substrate 1 and an effect of reducing the interface defect density cannot be obtained.

As described above, the SiC semiconductor device manufacturing method in the present embodiment includes a step of etching the surface of the SiC substrate 1 with $H_2$ gas under Si-excess atmosphere within a temperature range of 1000° C. to 1350° C., a step of depositing, by the CVD method, the $SiO_2$ film 2 at such a temperature that the SiC substrate 1 is not oxidized, and a step of thermally treating the SiC substrate 1 formed with the $SiO_2$ film 2 in NO gas atmosphere within a temperature range of 1150° C. to 1350° C. With this configuration, the defect density at the interface between the $SiO_2$ film 2 and the SiC substrate 1 can be significantly reduced, and a SiC MOSFET having a high channel mobility and normally-off characteristics can be achieved in a case where the SiC MOSFET having the $SiO_2$ film as the gate insulating film 20 is formed.

In the above-described embodiment, the example where the MOSFET is formed on the 4H—SiC(0001) plane has been described. Generally, it has been known that in a case where a SiC MOSFET is formed on a non-basal plane such as a (11-20) plane or a (1-100) plane, characteristics better than those in the case of a (0001) plane are obtained.

Actually, in a case where the MOSFET is formed in such a manner that the gate insulating film 20 is formed by the method shown in FIGS. 1A to 1C and the SiC substrate is subsequently thermally treated in NO gas atmosphere at 1250° C., the MOSFET formed on the (11-20) plane showed excellent characteristics of a channel mobility of 164 cm²/Vs and a threshold voltage of 1.21 V and the MOSFET formed on the (1-100) plane showed excellent characteristics of a channel mobility of 158 cm²/Vs and a threshold voltage of 1.28 V. As described above, the present invention is useful for many crystal planes of SiC substrates for actual use. Note that the acceptor density in the p⁻-type SiC epitaxial growth layer 10A in the MOSFET formed herein was $1 \times 10^{16}$ cm⁻³.

It has been known that among SiC power MOSFETs, a trench MOSFET having a MOS channel formed on a trench side wall is advantages in extremely reducing on-resistance. In this case, a SiC substrate surface is a (0001) plane, and therefore, the MOS channel needs to be formed on a (11-20) plane (A-plane) or a (1-100) plane (M-plane) which is a side wall surface. In an actual SiC power MOSFET, an acceptor density in a p-type epitaxial growth layer is a relatively-high value of about $10^{17}$ to 108 cm⁻³.

Thus, in order to verify whether or not the present invention is also effective for the trench SiC power MOS-FET, MOSFETs having the structure shown in FIG. 3 were formed using SiC substrates having a (11-20) plane and a (1-100) plane as surfaces by the method shown in FIGS. 1A to 1C while an acceptor density in a p-type epitaxial growth layer is changed within a range of $10^{17}$ to $10^{18}$ cm⁻³, and a channel mobility was measured. Moreover, as comparative examples, MOSFETs were formed, using SiC substrates having a (11-20) plane and a (1-100) plane as surfaces, in such a manner that a gate insulating film (SiO₂ film) 20 is formed on a SiC substrate 1 by thermal oxidation and the SiC substrate 1 is subsequently thermally treated in high-temperature NO gas atmosphere. Here, the thickness of the gate insulating film was 30 nm.

Figure 10:
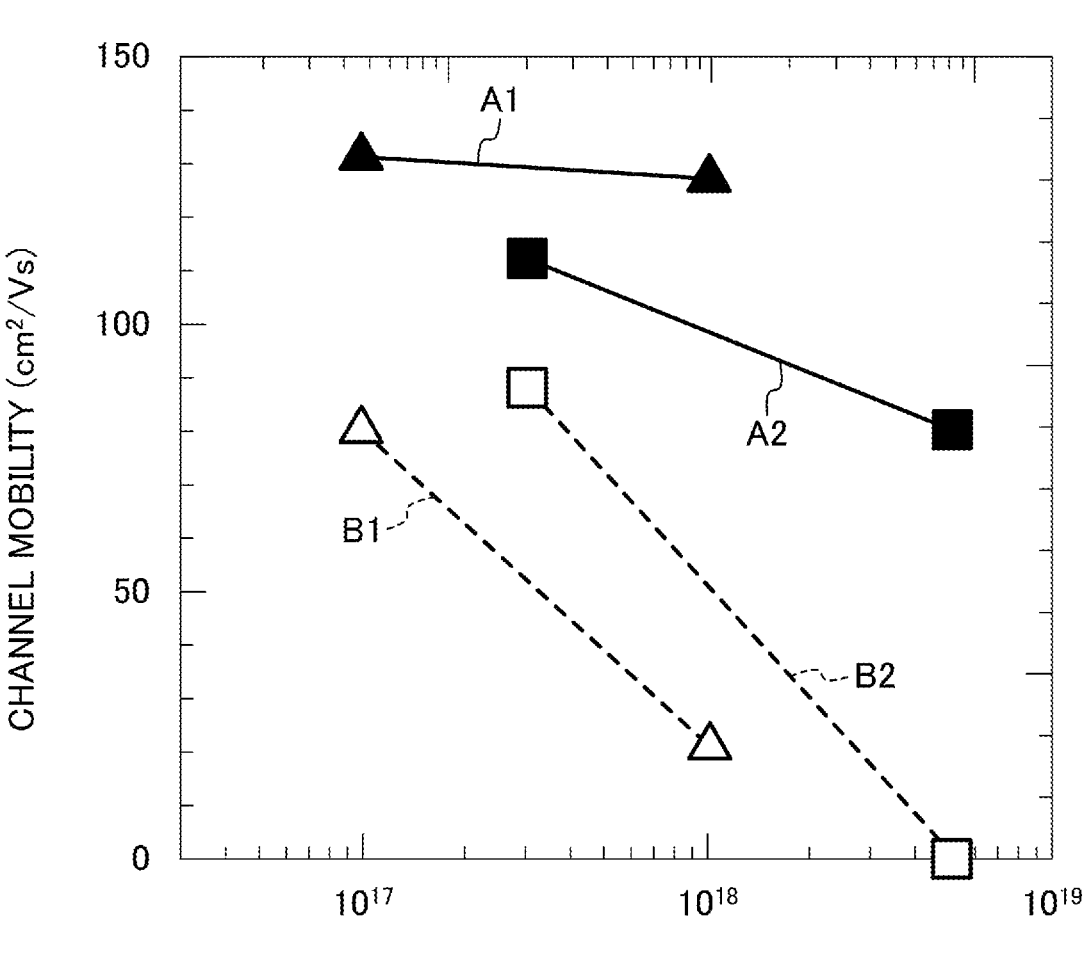
FIG. 10 shows graphs of the dependency of the channel mobility on an acceptor density in a p-type epitaxial growth layer.

FIG. 10 shows graphs of results, the vertical axis indicating the channel mobility and the horizontal axis indicating the acceptor density in the p-type epitaxial growth layer (p-type region).

As shown in a graph A1, the MOSFET formed on the (11-20) plane exhibited a high channel mobility of about 130 cm²/Vs within an acceptor density of $10^{17}$ to $10^{18}$ cm⁻³. As shown in a graph A2, the MOSFET formed on the (1-100) plane also exhibited a high channel mobility of 80 to 110 cm²/Vs within an acceptor density of $10^{17}$ to $10^{18}$ cm⁻³. In any of these MOSFETs, a channel mobility drop is rather small when the acceptor density in the p-type epitaxial growth layer increases, as compared to the MOSFETs indicated by B1 and B2 and formed by the typical method. At an acceptor density of $1 \times 10^{18}$ cm⁻³, an extremely-high channel mobility 6 to 80 times as high as that in the typical method was obtained.

According to the present invention, excellent MOS interface characteristics are obtained, and therefore, the present invention is also effective for formation of other SiC devices using MOS interfaces, such as an insulated-gate bipolar transistor (IGBT).

The present invention has been described above with reference to the preferable embodiment, but such description is not a limited matter and various modifications can be made, needless to say. For example, in the above-described embodiment, the SiC epitaxial layer is formed on the surface of the SiC substrate, and the SiO₂ film is formed on the SiC epitaxial layer. However, the SiO₂ film may be directly formed on the SiC substrate.

In the above-described embodiment, the SiC substrate from which the oxide film is removed after sacrificial oxidation of the surface is used. However, the manufacturing method of the present invention is also applicable to a SiC substrate not subjected to sacrificial oxidation.

In the above-described embodiment, the SiO₂ film 2 is deposited on the SiC substrate 1 by the CVD method. However, the SiO₂ film may be formed in such a manner that a Si thin film is deposited by the CVD method and is subsequently thermally oxidized at such a temperature that the SiC substrate 1 is not oxidized. In this case, the Si thin film is formed on the surface of the SiC substrate 1 before formation of the SiO₂ film 2, and therefore, etching of the SiC substrate 1 with high-temperature H₂ as pretreatment is not necessarily performed under Si-excess atmosphere. Etching of the SiC substrate 1 with high-temperature H₂ is preferably performed within a temperature range of 1200° C. to 1350° C.

DESCRIPTION OF REFERENCE CHARACTERS

1 SiC Substrate
2 SiO₂ Film
10 p-type SiC Substrate
10A p⁻-type SiC Epitaxial Growth Layer
11 Source Region
12 Drain Region
20 Gate Insulating Film
30 Source Electrode
31 Drain Electrode
32 Gate Electrode

The invention claimed is:

1. A SiC semiconductor device manufacturing method, comprising:
    a step (A) of etching a surface of a SiC substrate with H₂ gas under Si-excess atmosphere within a temperature range of 1000° C. to 1350° C.;
    a step (B) of depositing, by a CVD method, a SiO₂ film on the SiC substrate at such a temperature that the SiC substrate is not oxidized; and
    a step (C) of thermally treating the SiC substrate, on which the SiO₂ film is deposited, in NO gas atmosphere within a temperature range of 1150° C. to 1350° C.

2. The SiC semiconductor device manufacturing method according to claim 1, wherein
    in the step (A), a one-to-three monolayer thick Si layer is formed on the surface of the SiC substrate.

3. The SiC semiconductor device manufacturing method according to claim 1, wherein
    the step (A) is performed under atmosphere where SiH₄ gas or gas containing a Si atom is added to H₂ gas.

4. The SiC semiconductor device manufacturing method according to claim 1, further comprising:
    before the step (A), a step of etching away an oxide film formed on the surface of the SiC substrate after sacrificial oxidation of the SiC substrate.

5. The SiC semiconductor device manufacturing method according to claim 1, wherein
    the SiC substrate includes a SiC substrate having a SiC epitaxial layer on a surface.

6. The SiC semiconductor device manufacturing method according to claim 1, wherein
    an absolute value of an effective fixed charge density at an interface between the SiO₂ film and the SiC substrate is $4 \times 10^{11}$ cm⁻² or less.

* * * * *